US00RE40312E

(19) United States
(12) Reissued Patent
Kojima et al.

(10) Patent Number: US RE40,312 E
(45) Date of Reissued Patent: May 13, 2008

(54) DIGITAL DATA TRANSMITTING METHOD

(75) Inventors: Tadashi Kojima, Yokohama (JP); Koichi Hirayama, Yokohama (JP); Hisashi Yamada, Yokohama (JP); Yoshiaki Moriyama, Tsurugashima (JP); Fumihiko Yokogawa, Tsurugashima (JP); Takao Arai, Yokohama (JP); Toshifumi Takeuchi, Yokohama (JP); Shinichi Tanaka, Tuzukigun (JP); Akira Kurahashi, Yawatashi (JP); Toshiyuki Shimada, Kobeshi (JP)

(73) Assignee: Pioneer Electronic Corporation, Tokyo (JP)

(21) Appl. No.: 10/785,864
(22) Filed: Feb. 25, 2004

Related U.S. Patent Documents

Reissue of:
(64) Patent No.: 5,987,066
Issued: Nov. 16, 1999
Appl. No.: 08/759,956
Filed: Dec. 3, 1996

(30) Foreign Application Priority Data

Dec. 5, 1995 (JP) ..... 7-316420

(51) Int. Cl.
*H04B 14/04* (2006.01)

(52) U.S. Cl. ..... 375/253; 369/59.26; 375/242
(58) Field of Classification Search ..... 375/253, 375/242; 369/50, 58, 59, 59.26, 240, 48; 341/58, 59
See application file for complete search history.

(56) References Cited

U.S. PATENT DOCUMENTS

| | | | | |
|---|---|---|---|---|
| 4,124,778 A | | 11/1978 | Amass | |
| 4,539,667 A | | 9/1985 | Fujiie | |
| 4,544,962 A | | 10/1985 | Kato et al. | |
| 4,685,098 A | | 8/1987 | Yoshida | |
| 4,700,337 A | | 10/1987 | Inagawa et al. | |
| 4,731,678 A | | 3/1988 | Takeuchi | |
| 5,333,126 A | | 7/1994 | Fukuda et al. | |
| 5,375,249 A | | 12/1994 | Cho | |
| 5,523,991 A | | 6/1996 | Mizokami et al. | |
| 5,956,306 A | * | 9/1999 | Ishizawa et al. | 369/47.18 |

FOREIGN PATENT DOCUMENTS

| | | |
|---|---|---|
| EP | 0 673 027 A2 | 9/1995 |
| EP | 0 673 029 A1 | 9/1995 |
| JP | 61-196469 A | 8/1986 |
| JP | 62-272726 | 11/1987 |
| JP | 05-334810 | 12/1993 |
| JP | 6-267075 | 9/1994 |
| KR | 1991-0013186 A | 8/1991 |

OTHER PUBLICATIONS

Schouhamer Immink, K.A.: "EFMPlus: The Coding Format of the Multimedia Compact Disc" IEEE Transactions on Consumer Electronics, US, IEEE Inc., New York, vol. 41, No. 3, Aug. 1, 1995, pp. 491–497, XP000539497.
Schouhamer Immink, K.A.: "EFMPlus: The Coding Format of the High–Density Compact Disc" International Conference on Consumer Electronics—Digest of Technical Papers, US, New York, IEEE, vol. CONF. 14, Jun. 7, 1995, pp. 80–81, XP000547741.
* cited by examiner

*Primary Examiner*—Khai Tran
(74) *Attorney, Agent, or Firm*—Sughrue Mion, PLLC

(57) ABSTRACT

A transmitting method of digital data whereby information data can be reproduced at a high precision. In order to retain digital data in sectors comprising a plurality of sync frames and sequentially transmit, the sync frame is comprised of the sync signal and the run length limited code which satisfies the limitations of the minimum run length and the maximum run length, and the sync signal includes the sync pattern constituted by a bit pattern of a run length that is longer than the maximum run length by only 3T and addition bit patterns which are arranged before and after the bit pattern and each of which has a urn length that is longer than the minimum run length. The sync signal includes a specific code which indicates a position in the sector and which enables the DC control to be performed.

11 Claims, 8 Drawing Sheets

FIG. 2

| | SYNC SIGNAL WHEN CODE WORD JUST BEFORE IS NEXT_STATE 1 OR 2 | | | | | |
|---|---|---|---|---|---|---|
| | BIT 1 2 3 | 4 10 | 11 BIT 32 | BIT 1 2 3 | 4 10 | 11 BIT 32 |
| SY0 | 000 | 1001001 | 000100 0000000000010001 | 000 | 1001000 | 000100 0000000000010001 |
| SY1 | 000 | 0010000 | 000100 0000000000010001 | 000 | 0010001 | 000100 0000000000010001 |
| SY2 | 000 | 1000000 | 000100 0000000000010001 | 000 | 1000001 | 000100 0000000000010001 |
| SY3 | 000 | 0100000 | 000100 0000000000010001 | 000 | 0100001 | 000100 0000000000010001 |
| SY4 | 001 | 0000000 | 000100 0000000000010001 | 001 | 0000001 | 000100 0000000000010001 |
| SY5 | 001 | 0001001 | 000100 0000000000010001 | 001 | 0001000 | 000100 0000000000010001 |
| SY6 | 001 | 0010010 | 000100 0000000000010001 | 001 | 0000010 | 000100 0000000000010001 |
| SY7 | 001 | 0010001 | 000100 0000000000010001 | 001 | 0010000 | 000100 0000000000010001 |

FIG.3

| | SYNC SIGNAL WHEN CODE WORD JUST BEFORE IS NEXT_STATE 3 OR 4 | | | | | |
|---|---|---|---|---|---|---|
| | BIT 1 2 3 | 4 10 | 11 32 BIT | BIT 1 2 3 | 4 10 | 11 32 BIT |
| SY0 | 100 | 1001000 | 000100 0000000000010001 | 100 | 1001001 | 000100 0000000000010001 |
| SY1 | 100 | 0010001 | 000100 0000000000010001 | 100 | 0010000 | 000100 0000000000010001 |
| SY2 | 100 | 1000001 | 000100 0000000000010001 | 100 | 1000000 | 000100 0000000000010001 |
| SY3 | 100 | 0001001 | 000100 0000000000010001 | 100 | 0001000 | 000100 0000000000010001 |
| SY4 | 100 | 0100001 | 000100 0000000000010001 | 100 | 0100000 | 000100 0000000000010001 |
| SY5 | 100 | 0100100 | 000100 0000000000010001 | 100 | 0000100 | 000100 0000000000010001 |
| SY6 | 100 | 1000010 | 000100 0000000000010001 | 100 | 0000001 | 000100 0000000000010001 |
| SY7 | 100 | 0100010 | 000100 0000000000010001 | 100 | 0000010 | 000100 0000000000010001 |

FIG. 8

| | | |
|---|---|---|
| 1 | SY0 | SY5 |
| 2 | SY1 | SY5 |
| 3 | SY2 | SY5 |
| 4 | SY3 | SY5 |
| 5 | SY4 | SY5 |
| 6 | SY1 | SY6 |
| 7 | SY2 | SY6 |
| 8 | SY3 | SY6 |
| 9 | SY4 | SY6 |
| 10 | SY1 | SY7 |
| 11 | SY2 | SY7 |
| 12 | SY3 | SY7 |
| 13 | SY4 | SY7 |

DIGITAL DATA TRANSMITTING METHOD

Matter enclosed in heavy brackets [ ] appears in the original patent but forms no part of this reissue specification; matter printed in italics indicates the additions made by reissue.

*This application is a reissue of application Ser. No. 08/759,956, filed on Dec. 3, 1996, now U.S. Pat. No. 5,987,066, which claims priority under 35 U.S.C. § 119 from Japanese Patent Application JP 7-316420 filed Dec. 5, 1995. More than one reissue application has been filed for the reissue of U.S. Pat. No. 5,987,066. The reissue applications are application Ser. No. 10/785,864 (the present application) and continuation application Ser. Nos. 11/638,659, 11/638,660 and 11/638,661.*

BACKGROUND OF THE INVENTION

1. Field of the Invention

The invention relates to a method of transmitting digital data in which digital data is retained in sectors each comprising a plurality of sync frames and sequentially transmitting it (including recording of the digital data).

2. Description of Background Information

As an RLL (Run Length Limited) encoding method which is performed in order to transmit digital data indicative of information or record the digital data to a recording medium, an EFM (Eight to Fourteen Modulation) which is used for a CD (compact disc) or the like is known.

In the EFM, digital data of eight bits (one byte) is converted to a run length limed code of 14 bits which satisfies run length limitations of:

minimum run length d=2T;

maximum run length k=10T;

connection bits of three bits are added to intervals among the respective converted data, and the resultant data is formed as an EFM modulation signal. In a sequence of the EFM modulation signals as well, a bit rain of the connection bits is set so as to satisfy the foregoing run length limitation.

In the CD, a signal obtained by adding a sync signal to the EFM modulation signal has been recorded. The sequence by the EFM modulation signals is constructed in a manner such that a repetitive pattern of maximum interval which corresponds to the maximum run length k, namely, repetitive pattern such as 11T-11T doesn't exist in the sequence and the repetitive pattern of 11T is used as a sync signal.

In a CD player, the sync signal is extracted by detecting the repetitive pattern of 11T from a signal read out from the CD.

In a DVD (digital video disc) in which recording information has been recorded at a high density or a high-density data transmission, however, when reading the information, it is largely influenced by an inter-symbol interference. The repetitive pattern of 11T as a sync signal is, therefore, changed to a pattern such as 11T-10T or 10T-11 and is read out. On the contrary, a case where the data pattern such as 10T-11T or 11T-10T as an EFM modulation signal is changed to the repetitive pattern of 11T and is erroneously detected as a sync signal occurs.

As mentioned above, in the high-density recording or high-density data transmission, a frequency of errors which occur in the detection of the sync signal increases and a burst error due to out-of-synchronism easily occurs.

SUMMARY AND OBJECT OF THE INVENTION

The invention is made to solve the problems mentioned above and it is an object of the invention to provide a transmitting method of digital data whereby the digital data can be reproduced at a high precision even at the time of a high-density recording or a high-density data transmission.

According to the invention, there is provided a transmitting method of digital data for retaining digital data in sectors each comprising a plurality of sync frames and sequentially transmitting, wherein the sync frame comprises a sync signal and a run length limited code which corresponds to the digital data and satisfies limitations of a minimum run length and a maximum run length, and the sync signal includes a sync pattern comprising a bit pattern having a run length which is longer than the maximum run length by 3T and addition bit patterns which are arranged before and after the bit pattern and each of which has a run length that is longer than the minimum run length.

According to the invention, there is also provided a transmitting method of digital data for storing the digital data into sectors each comprising a plurality of sync frames and sequentially transmitting, wherein the sync frame comprises a sync signal and a run length limited code which corresponds to the digital data and satisfies limitations regarding a minimum run length and a maximum run length, and the sync signal includes a specific code which indicates a position in the sector and which enables a DC control to be performed.

In order to retain the digital data into the sectors each comprising a plurality of sync frames and sequentially transmit, the sync frame is comprised of the sync signal and the run length limited code which satisfies the limitations of the minimum run length and the maximum run length, and the sync signal includes the sync pattern comprising the bit pattern of the run length that is longer than the maximum run length by 3T and the addition bit patterns which are arranged before and after the bit pattern and each of which has a run length that is longer than the minimum run length. The sync signal includes the specific code which indicates the position in the sector and which enables the DC control to be performed.

BRIEF DESCRIPTION OF THE DRAWINGS

FIG. 2 is a diagram showing a sync signal according to the invention;

FIG. 3 is a diagram showing the sync signal according to the invention;

FIG. 8 is a diagram showing storage contents in a memory.

DETAILED DESCRIPTION OF THE PREFERRED EMBODIMENT

Figure 1:
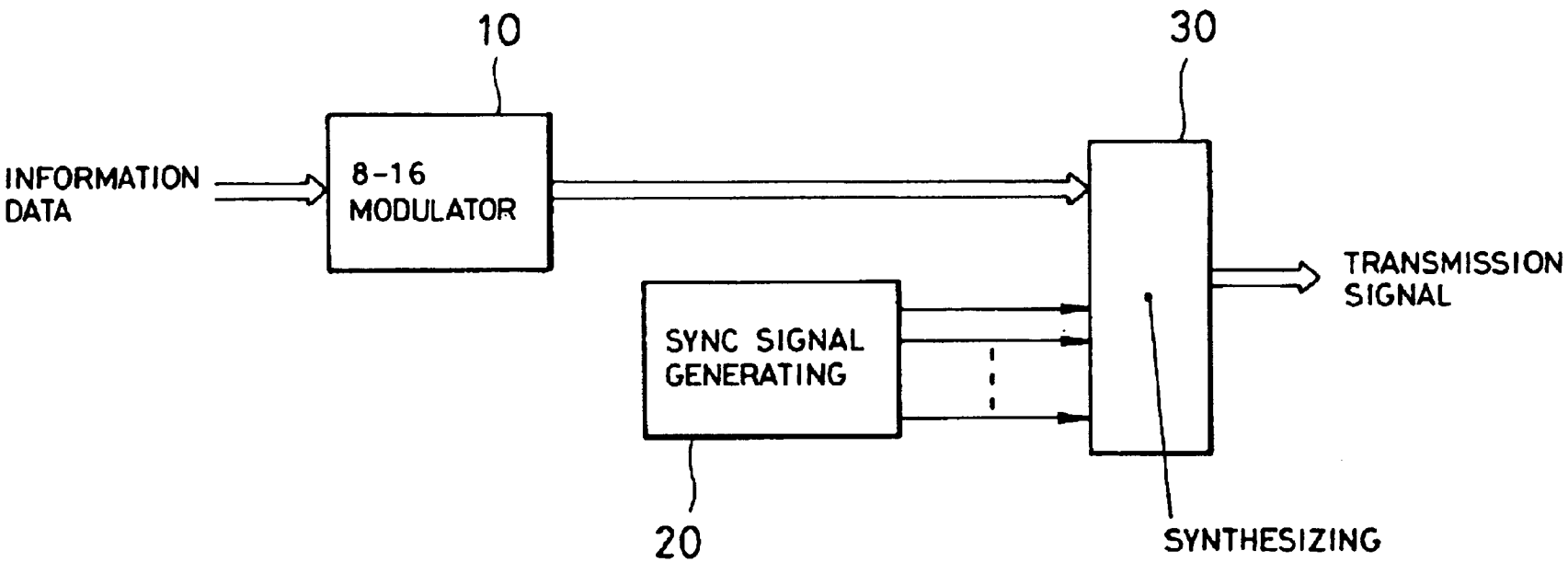
FIG. 1 is a diagram showing a schematic construction of a transmission signal forming apparatus for forming a transmission signal by a digital data transmitting method according to the invention.

FIG. 1 is a diagram showing a construction of a transmission signal forming apparatus for forming a transmission signal by a transmitting method of digital data according to the invention.

In FIG. 1, an 8-16 (eight to sixteen) modulator 10 converts digital data to be transmitted to an 8-16 modulation signal (run length limited code) of 16 bits (one code word) such that run length limitations of the minimum run length d=2T and the maximum run length k=10T are satisfied every eight bits.

All of code words obtained by the 8-16 modulator 10 have pattern forms which satisfy any one of the following conditions of Next_State1 to Next_State4.

Next_State1: Code word in which the number of continuous 0 at the termination is equal to 0 to 1.

Next_State2: Code word in which the number of continuous 0 at the termination is equal to 2 to 5 and the first bit and 13th bit of the next code word are equal to 0.

Next_State3: Code word in which the number of continuous 0 at the termination is equal to 2 to 5 and at least either one of the first and 13th bits of the next code word is equal to 0.

Next_State4: Code word in which the number of continuous 0 at the termination is equal to 6 to 9.

The modulating method has been published by the following paper.

Kees A. Schouhamer Immink "EFMPlus: The Coding format of the High-Density Compact Disc", IEEE International Conference on Consumer Electronics, WPM6.1, 1995.

A sync signal generating circuit 20 generates 32 sync signals having different bit patterns as shown in FIGS. 2 and 3 and transmits them to a synthesizing circuit 30 which preferably includes a CPU and a memory as described later.

Those 32 sync signals are divided into eight groups of SY0 to SY7 as shown in FIGS. 2 and 3.

Figure 4:
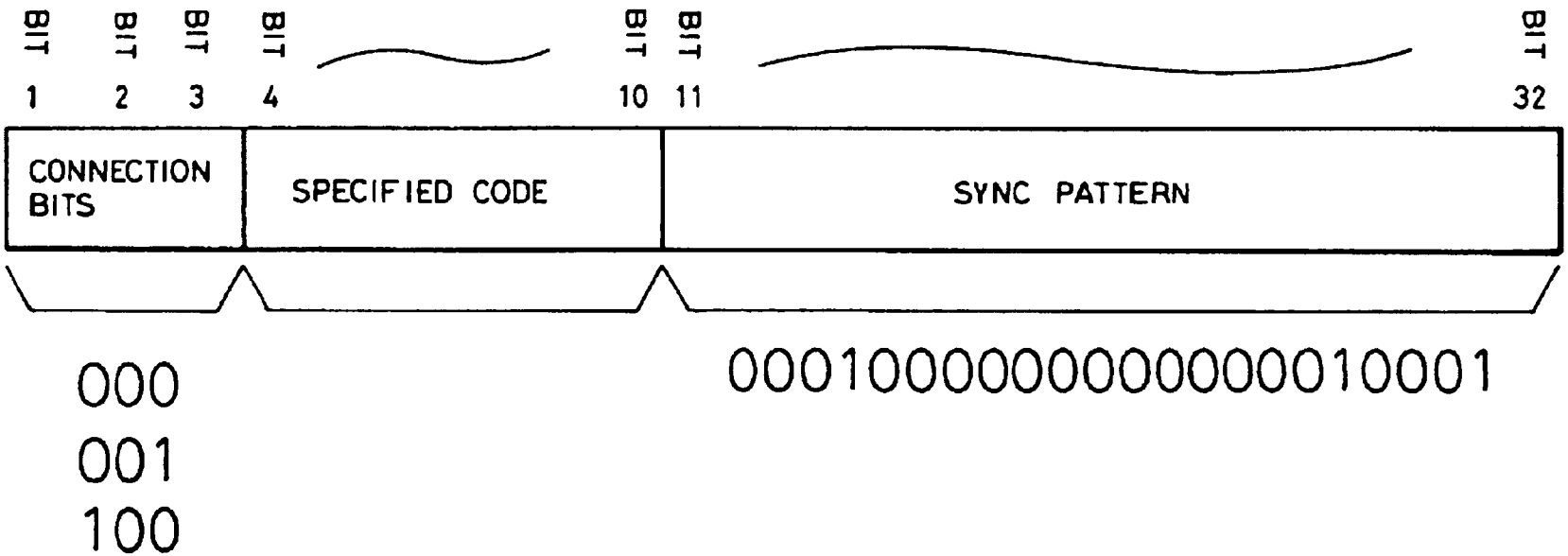
FIG. 4 is a diagram showing a format of the sync signal.

FIG. 4 is a diagram showing a format of the sync signal.

In FIG. 4, bits 1 to 3 of the sync signal denote connection bits provided so as to satisfy the foregoing limitations of the minimum run length d and the maximum run length k when the sync signal is connected to a code word just before it. A connection bit pattern by bits 1 to 3 indicate any one of {000}, {001}, and {100}.

A sync pattern to identify the sync signal is allocated to bits 11 to 32 of the sync signal.

The sync pattern is a bit pattern of an arrangement such as (4T or more-14T-4T) in which a pattern of 14T that is larger than the maximum interval 11T in the 8-16 modulation signal by 3T is set to a nucleous and a pattern of a fixed length of 4T and a pattern of 4T or more are arranged after and before the pattern of 14T, respectively, namely, bit pattern of {00010000000000000010001}.

In this instance, the sync pattern is a fixed pattern which is common to all sync signals as shown in FIGS. 2 and 3.

In the sync pattern, even when the 11T pattern in the 8-16 modulation signal is edge-shifted due to an influence by an inter-symbol interference and is changed to a pattern of 12T and, further, the sync pattern itself is edge-shifted and is shortened by only 1T, in order to enable both of them to be distinguished, the pattern of 14T that is larger than the maximum interval 11T in the 8-16 modulation signal by 3T is used. The 14T pattern denotes a shortest length which can be set when considering the edge-shift.

By arranging an addition bit pattern of a fixed length of 4T and an addition bit pattern of 4T or more after and before the 14T pattern, an interval that is larger than the shortest bits of 3T by at least 1T is provided, thereby reducing an influence by the inter-symbol interference with a neighboring mark.

Figure 5:
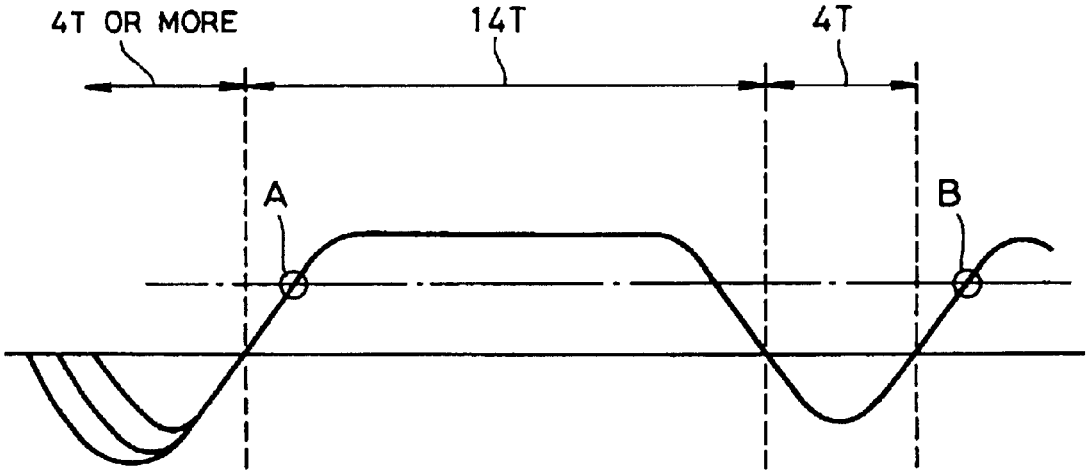
FIG. 5 is a diagram showing a transmission signal waveform by a sync pattern.

FIG. 5 is a diagram showing a transmission signal waveform by the sync pattern.

As shown in FIG. 5, if points of leading (trailing when the waveform is inverted) of the edges, namely, an interval between points A and B is detected by a slice level shown by an alternate long and short dash line, even when the slice level is not settled by a pull-in operation or the like, the edge interval can be stably detected. By detecting a 18T pattern in which the 14T pattern and the rear 4T pattern are combined and selecting the pattern in which the pattern of 14T exists, the selected pattern can be used as a signal for a speed detection of a spindle servo upon staring. By setting mark lengths before and after the 14T pattern to be equal to or larger than 4T in which an amplitude is larger than the shortest mark length, a permissible amplitude is increased for a fluctuation of the slice level. Although it is also possible to use the combination of marks of 5T or mores according to the embodiment, since an efficiency is preferentially considered, a rear mark length is set to 4T and a front mark length is set to 4T or more.

The reason why the rear pattern of the 14T pattern is set to the fixed length of 4T and the front pattern is set to 4T or more is because when a specific code, which will be described hereinafter, is further set before the 14T pattern, a degree of freedom of the front pattern is increased and the number of patterns to be obtained as a specific code is sufficiently assured.

As shown in FIG. 4, the specific code is allocated to bits 4 to 10 of the sync signal. Depending on the combination with the connection bits which exist just before the specific code, a position in one sector, which will be explained hereinafter, can be identified.

The synthesizing circuit 30 in FIG. 1 selects any one of the sync signals generated by the sync signal generating circuit 20 every train of the 8-16 modulation signals which are sequentially supplied from the 8-16 modulator 10, namely, every 91 code words and generates a signal obtained by adding the selected sync signal to the head of the 91 code words as a transmission signal corresponding to one sync frame.

Figure 6:
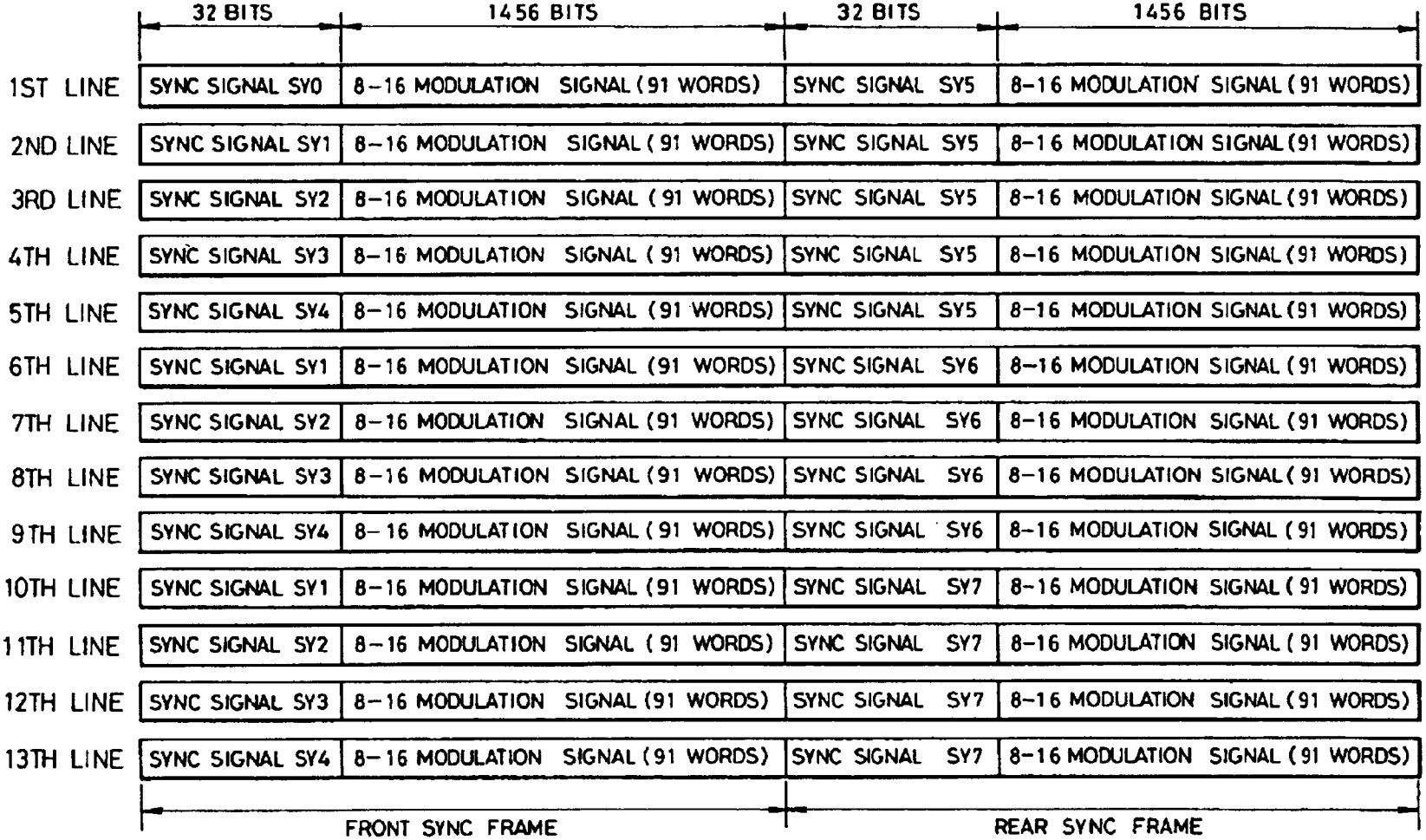
FIG. 6 is a diagram showing a transmission signal format of one sector.

FIG. 6 is a diagram showing a format of the transmission signal per one sector which is generated by the synthesizing circuit 30.

As shown in FIG. 6, one sector comprises 13 lines. Two sync frames are allocated to each line. The sync signal allocated to each sync frame is selected from the 32 kinds of sync signals shown in FIGS. 2 and 3. For example, the sync signal allocated to a front sync frame of the first line corresponds to SY0 selected from the 32 kinds of sync signals. Subsequent to the first line, the sync signal which is allocated to the front sync frame is cyclically repeated like SY1 to SY4 in accordance with an increase in number of line. Differences among SY1 to SY4 are decided by the specific code and connection bits.

The operation of the synthesizing circuit 30 for forming the transmission signal of one sector will now be described with reference to a flow of FIG. 7.

A CPU (central processing unit) and a memory (they are not shown) are included in the synthesizing circuit 30 and information as shown in FIG. 8 has previously been stored in the memory.

Figure 7:
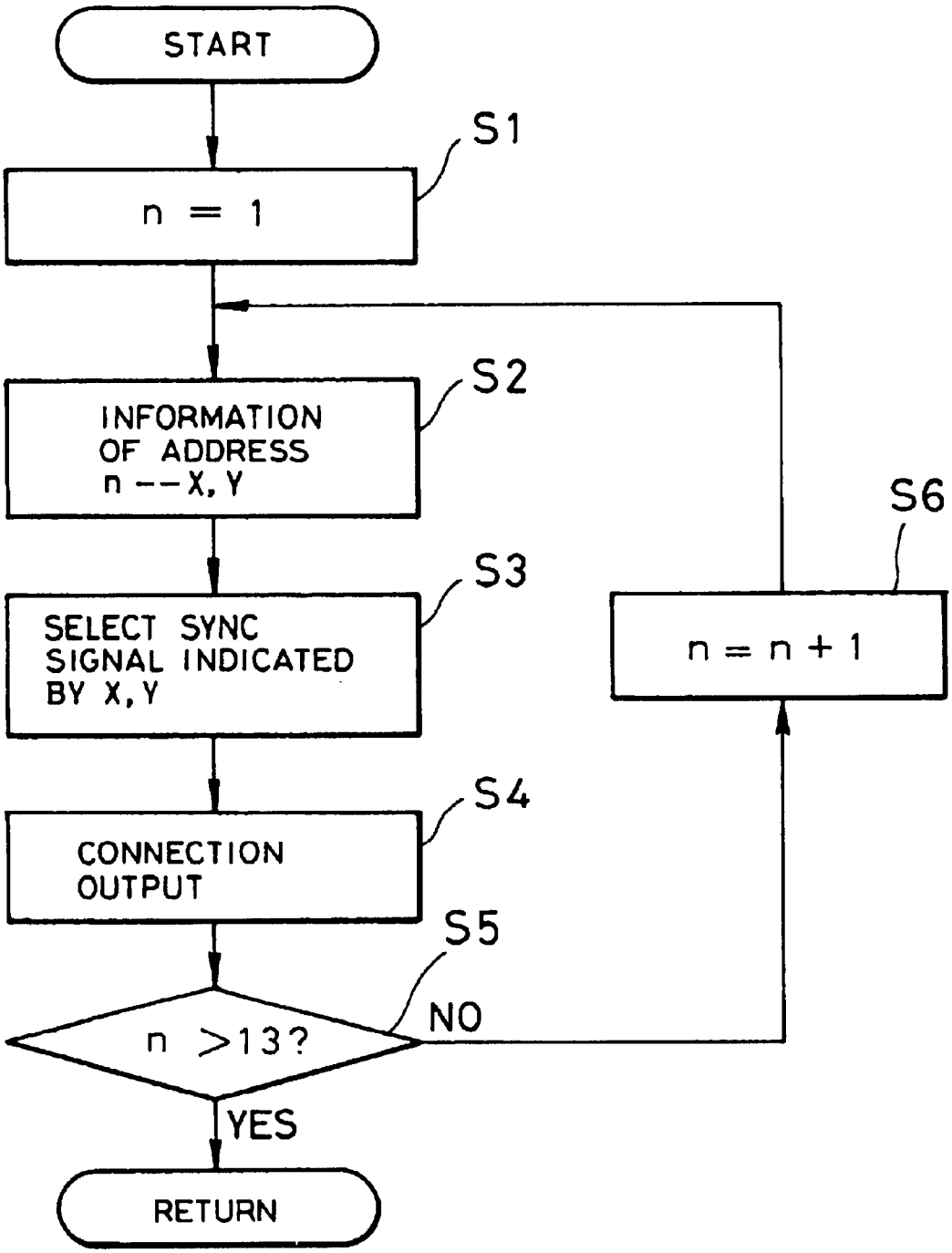
FIG. 7 is a diagram showing an operation flow of a synthesizing circuit 30.

In the flow of FIG. 7, the CPU in the synthesizing circuit 30 first sets 1 as an initial address into a built-in register n (step S1). The CPU reads out information corresponding to the address stored in the register n from the memory shown in FIG. 8, respectively and stores the information into registers X and Y (step S2). When 1 has been stored in the register n, for instance, SY0 and SY5 stored in address 1 in the memory of FIG. 8 are read out and stored into the registers X and Y, respectively.

The CPU selects the sync signal corresponding to the storage contents in the register X from the 32 kinds of sync signals shown in FIGS. 2 and 3 which are supplied from the sync signal generating circuit 20. When SY0 has been stored in the register X, for example, the signal corresponding to SY0 is selected from the 32 kinds of sync signals shown in FIGS. 2 and 3. When the code word existing just before the sync signal is Next_State1 (the number of continuous 0 at the termination is equal to 1 or 0) or Next_State2 (the number of continuous 0 at the termination is equal to 2 to 5), the CPU selects the sync signal in which the connection bit pattern by bits 1 to 3 is set to {000} from SY0 shown in FIGS. 2 and 3. There are the following two kinds of sync signals SY0 to which the connection bit pattern is equal to {000} in FIG. 2: {00010010010001000000000000010001} {00010010000001000000000000010001}

That is, only the values of bit 10 in the specific codes differ with respect to the two sync signals SY0 and the numbers of inverting times of them different when they are NZI modulated. The CPU selects the pattern which is optimum for the DC suppression from the two kinds of patterns and sets the selected pattern to final SY0.

The CPU selects the sync signal corresponding to the storage contents in the register Y. For example, when SY5 has been stored in the register Y, the sync signal corresponding to SY5 is selected from the 32 kinds of sync signals shown in FIGS. 2 and 3. When the code word existing just before the sync signal is Next_State3 (the number of continuous 0 at the termination is equal to 2 to 5) or Next_State4 (the number of continuous 0 at the termination is equal to 6 to 9), the CPU selects the sync signal in which the connection bit pattern by bits 1 to 3 is equal to {100} from SY5 shown in FIGS. 2 and 3. There are the following two kinds of sync signals in which the connection bit pattern is equal to {100} in FIG. 3: {10001001000001000000000000010001} {10000001000001000000000000010001}

That is, only the values of bit 5 in the specific codes differ with respect to the both patterns. The CPU selects the pattern which is optimum for the DC suppression from the two kinds of patterns and sets the selected pattern to final SY5 (step S3).

The CPU generates a pattern obtained by serially connecting the 8-16 modulation signal of 91 code words to each of the sync signals selected on the basis of the storage contents of the registers X and Y as mentioned above as a transmission signal of one line as shown in FIG. 6 (step S4).

The CPU judges whether the contents in the register n are larger than 13 or not (step S5). In step S5, until it is decided that the contents in the register n are larger than 13, the CPU adds 1 to the contents in the register n (step S6) and, after that, repetitively executes the operations in step S2 and subsequent steps. The transmission signals of the first to 13th lines (of one sector) as shown in FIG. 6 are sequentially generated by the repetitive operation.

For example, when it is assumed that 16 sectors are error-correction encoded as one error correction block and the resultant block is transmitted, a decoder side which receives the transmission signal with the structure executes an error correcting process by using the transmission signals each of which has the sector structure as shown in FIG. 6 and which are collected by the number as many as 16 sectors as one error-correction block. In the decoder, it is important that after completion of the reception of the transmission signal, the head of the sector is searched, an address recorded is subsequently immediately read out, and data of the error-correction block is collected. When the high-density transmission is executed, there is a case where the sync signal SY0 as a head of the sector cannot be read out or a case where the other signal is erroneously read out as a sector head, so that a possibility such that a fatal error which cannot be corrected is caused occurs.

In the transmission signal according to the invention, as shown in FIGS. 2 and 3, the 32 kinds of sync signals having different bit patters are prepared and, further, as shown in FIG. 6, the combination pattern of the sync signal to be allocated to each line in one sector is set to a unique pattern every line. As shown in FIG. 6, the sync signal in the front sync frame existing at the head of each line is cyclically repeated like SY1 to SY4 in accordance with an increase in number of lines.

On the decoder side which receives the transmission signal having the structure, the line in one sector can be specified by recognizing the combination pattern of the sync signals, so that the position of SY0 at the sector head can be predicted. When the line is specified, a preventing function can be further raised for a read error of the sync signal by recognizing the repetitive patterns of SY1 to SY4. Since the line is specified on the basis of the combination pattern of the two sync signals existing in one line, it is sufficient to use eight kinds of SY0 to SY7 as kinds of sync signals in one sector Even when the sync signal SY0 as a head of the sector cannot be read out due to the influence by the high-density transmission, therefore, on the decoder side, the head position of the sector is recognized on the basis of the sync signal existing after SY0, thereby enabling a correct error-correction block to be recognized.

As will be obviously understood by FIGS. 2 and 3, further, SY0 is selected in a manner such that an inter-code distance between SY0 and the head syncs (SY1 to SY4) of each of the other lines becomes maximum. The inter-code distance denotes a similarity between the sync signals. When there is a sync signal in which the number of 1 differs from that of the other signal, it is determined that the sync signal is a signal of the largest distance. In case of the sync signal in which the number of 1 is equal to that of the other sync signal, the number of shifting times of the position of 1 until the signal coincides with a sync signal is set to the distance with the sync signal. By determining SY0 as mentioned above, a probability such that SY1 to SY4 are erroneously read as SY0 is reduced. In other words, the sync signal which is relatively similar to SY0 is set to the intermediate sync signal (SY5 to SY7) of each lie, and a common sync signal is not used in the head and middle portions of each line. When the common sync signal is not used in the head and middle portions of the line, there is also an effect such that a probability such that the head and middle portions of each line is erroneously recognized by the read error is reduced.

As shown in FIGS. 2 and 3, even when $Next_{13}$State of the code word just before the sync signal indicates either one of a case of 1 or 2 and a case of 3 or 4, two kinds of 32-bit patterns in which the even and odd numbers of inverting lines (the numbers of 1) and the sings of disparity (a difference between positive and negative bits of the waveform) are different respectively are allocated to SY0 to SY7. That is, as compared with one pattern, since the polarities of the DC component of the other pattern itself and the signal waveform at the termination of the other pattern are opposite to those of one pattern, the DC component of the signal can be reduced by selecting either one of them.

As mentioned above, in the digital data transmitting method according to the invention, when the digital data is retained in the sectors each comprising a plurality of sync frames and is sequentially transmitted, the sync frame comprises the sync signal and the run length limited code which satisfies the limitations of the minimum run length and the maximum run length, and the sync signal includes the sync pattern comprised of the bit pattern of a run length which is longer than the maximum run length by 3T and the addition bit patterns which are arranged before and after the bit pattern and each of which has a run length that is longer than the minimum run length.

According to the invention, therefore, even when the sync signal and signal by the run length limited code are edge-shifted by 1T, respectively, due to the influence by the inter-symbol interference, they can be correctly distinguished and detected.

In the digital data transmitting method according to the invention, the sync signal includes the specific code which indicates the position in the sector and which enables the DC control to be performed.

With the construction, therefore, even when the sync signal at the head of the sector cannot be read out or the other signal is erroneously read out as a sector head, a correct head of the sector can be predicated on the basis of other sync signals, so that digital data can be properly reproduced.

The invention has been described above with reference to the preferred embodiments thereof. It will be understood that many modifications and variations can be made by those skilled in the rt. All of the modifications and variations are incorporated within the scope of the appended claims.

What is claimed is:

[1. A transmitting method of digital data for retaining digital data in sectors each comprising a plurality of sync frames and sequentially transmitting the data, wherein said sync frame comprises a sync signal and a run length limited code which corresponds to said digital data and satisfies limitations of a minimum run length and a maximum run length, and said sync signal includes a sync pattern comprised of a bit pattern of a run length which is longer than said maximum run length by 3T and addition bit patterns which are arranged before and after said pattern and each of which has a run length that is longer than said minimum run length.]

[2. A method according to claim 1, wherein among said addition bit patterns, the addition bit pattern arranged after said bit pattern has a fixed length.]

[3. A method according to claim 1, wherein said run length limited code is a code obtained by 8-16 modulating said digital data every eight bits so as to satisfy run length limitations of the minimum run length is 2 and the maximum run length is 10, and said sync pattern is comprised of bit patterns of run lengths of (4T or more -14T-4T).]

4. A transmitting method of digital data for retaining the digital data in sectors each comprising a plurality of sync frames and sequentially transmitting the data, wherein said sync frame comprises a sync signal and a run length limited code which corresponds to said digital data and satisfies limitations of a minimum run length and a maximum run length, and said sync signal includes a specific code indicative of a position in said sector.

5. A method according to claim 4, wherein said sector comprises s plurality of lines each of which is constituted by said two sync frames, and a position in said sector is identified by said specific code included in each of said two sync signals included every said line.

6. A method according to claim 5, wherein either one of said two sync signals included every said line is cyclically repeated with an increase in number of said lines, based on said specific code included in said sync signal.

7. A method according to claim 4, wherein said specific code in said sync signal arranged at a head of a first line of said sector has a bit pattern in which an inter-code distance for said sync signal arranged at the head of the other line becomes maximum.

8. A method according to claim [3]*4*, wherein a DC control can be performed by [the] bit patterns of said specific code.

9. A method according to claim 8, wherein two kinds of codes having different numbers of inverting times when they are NRZI modulated can be selected as said specific code, thereby performing said DC control.

10. A method according to claim 5, wherein said sector comprises 13 lines each of which is constituted by said two sync frames, and said sync signal has 32 kinds of bit patterns in order to satisfy the limitations of said minimum run length and said maximum run length, specify the head of said sector and each line, and perform said DC control in a connection with said run length limited code existing just before said sync signal.

11. A method according to claim 7, wherein said sector comprises 13 lines each of which is constituted by said two sync frames, and said sync signal has 32 kinds of bit patterns in order to satisfy the limitations of said minimum run length and said maximum run length, specify the head of said sector and each line, and perform said DC control in a connection with said run length limited code existing just before said sync signal.

12. A method according to claim 8, wherein said sector comprises 13 lines each of which is constituted by said two sync frames, and said sync signal has 32 kinds of bit patterns in order to satisfy the limitations of said minimum run length and said maximum run length, specify the head of said sector and each line, and perform said DC control in a connection with said run length limited code existing just before said sync signal.

13. A transmitting method of digital data for retaining digital data in sectors each comprising a plurality of sync frames and sequentially transmitting, wherein said sync frame comprises a sync signal of 32 bits and a run length limited code obtained by 8-16 modulating said digital data every eight bits so as to satisfy run length limitations of a minimum run length is 2 and a maximum run length is 10, and said sync signal comprises: a connection bit of three bits arranged so as to satisfy the limitations of said minimum run length is 2 and said maximum run length is 10 in a connection with said run length limited code existing just before said sync signal; a specific code of seven bits which satisfies the limitations of said minimum run length =2 and said maximum run length =10 and which has 32 kinds of bit patterns; and sync patterns of run lengths of (4T or more-14T-4T).

14. A method according to claim 13, wherein said sync signal has 32 kinds of bit patterns shown in the following Table 1 and Table 2, and an arrangement of said sync signals in each line of said sector is set to an arrangement shown in the following Table 3:

TABLE 1

| | | | | | | | |
|---|---|---|---|---|---|---|---|
| SY0 | 000 | 1001001 | 000100 | 0000000000010001 | 000 | 1001000 | 000100 0000000000010001 |
| SY1 | 000 | 0010000 | 000100 | 0000000000010001 | 000 | 0010001 | 000100 0000000000010001 |
| SY2 | 000 | 1000000 | 000100 | 0000000000010001 | 000 | 1000001 | 000100 0000000000010001 |
| SY3 | 000 | 0100000 | 000100 | 0000000000010001 | 000 | 0100001 | 000100 0000000000010001 |
| SY4 | 001 | 0000000 | 000100 | 0000000000010001 | 001 | 0000001 | 000100 0000000000010001 |
| SY5 | 001 | 0001001 | 000100 | 0000000000010001 | 001 | 0001000 | 000100 0000000000010001 |
| SY6 | 001 | 0010010 | 000100 | 0000000000010001 | 001 | 0000010 | 000100 0000000000010001 |
| SY7 | 001 | 0010001 | 000100 | 0000000000010001 | 001 | 0010000 | 000100 0000000000010001 |

TABLE 2

| | | | | | | | |
|---|---|---|---|---|---|---|---|
| SY0 | 100 | 1001000 | 000100 | 0000000000010001 | 100 | 1001001 | 000100 0000000000010001 |
| SY1 | 100 | 0010001 | 000100 | 0000000000010001 | 100 | 0010000 | 000100 0000000000010001 |
| SY2 | 100 | 1000001 | 000100 | 0000000000010001 | 100 | 1000000 | 000100 0000000000010001 |
| SY3 | 100 | 0001001 | 000100 | 0000000000010001 | 100 | 0001000 | 000100 0000000000010001 |
| SY4 | 100 | 0100001 | 000100 | 0000000000010001 | 100 | 0100000 | 000100 0000000000010001 |
| SY5 | 100 | 0100100 | 000100 | 0000000000010001 | 100 | 0000100 | 000100 0000000000010001 |
| SY6 | 100 | 1000010 | 000100 | 0000000000010001 | 100 | 0000001 | 000100 0000000000010001 |
| SY7 | 100 | 0100010 | 000100 | 0000000000010001 | 100 | 0000010 | 000100 0000000000010001 |

TABLE 3

| | 32 bits | 1456 bits | 32 bits | 1456 bits |
|---|---|---|---|---|
| 1st LINE | SYNC SIGNAL SY0 | RUN LENGTH LIMITED CODE | SYNC SIGNAL SY5 | RUN LENGTH LIMITED CODE |
| 2nd LINE | SYNC SIGNAL SY1 | RUN LENGTH LIMITED CODE | SYNC SIGNAL SY5 | RUN LENGTH LIMITED CODE |
| 3rd LINE | SYNC SIGNAL SY2 | RUN LENGTH LIMITED CODE | SYNC SIGNAL SY5 | RUN LENGTH LIMITED CODE |
| 4th LINE | SYNC SIGNAL SY3 | RUN LENGTH LIMITED CODE | SYNC SIGNAL SY5 | RUN LENGTH LIMITED CODE |
| 5th LINE | SYNC SIGNAL SY4 | RUN LENGTH LIMITED CODE | SYNC SIGNAL SY5 | RUN LENGTH LIMITED CODE |
| 6th LINE | SYNC SIGNAL SY1 | RUN LENGTH LIMITED CODE | SYNC SIGNAL SY6 | RUN LENGTH LIMITED CODE |
| 7th LINE | SYNC SIGNAL SY2 | RUN LENGTH LIMITED CODE | SYNC SIGNAL SY6 | RUN LENGTH LIMITED CODE |
| 8th LINE | SYNC SIGNAL SY3 | RUN LENGTH LIMITED CODE | SYNC SIGNAL SY6 | RUN LENGTH LIMITED CODE |
| 9th LINE | SYNC SIGNAL SY4 | RUN LENGTH LIMITED CODE | SYNC SIGNAL SY6 | RUN LENGTH LIMITED CODE |
| 10th LINE | SYNC SIGNAL SY1 | RUN LENGTH LIMITED CODE | SYNC SIGNAL SY7 | RUN LENGTH LIMITED CODE |
| 11th LINE | SYNC SIGNAL SY2 | RUN LENGTH LIMITED CODE | SYNC SIGNAL SY7 | RUN LENGTH LIMITED CODE |
| 12th LINE | SYNC SIGNAL SY3 | RUN LENGTH LIMITED CODE | SYNC SIGNAL SY7 | RUN LENGTH LIMITED CODE |
| 13th LINE | SYNC SIGNAL SY4 | RUN LENGTH LIMITED CODE | SYNC SIGNAL SY7 | RUN LENGTH LIMITED CODE |
| | FRONT SYNC FRAME | | REAR SYNC FRAME | |

* * * * *